United States Patent
Carlson-Stevermer (10) Patent No.: US 7,230,441 B2
(45) Date of Patent: Jun. 12, 2007

(54) WAFER STAGING PLATFORM FOR A WAFER INSPECTION SYSTEM

(75) Inventor: Craig K. Carlson-Stevermer, Shoreview, MN (US)

(73) Assignee: Rudolph Technologies, Inc., Flanders, NJ (US)

(*) Notice: Subject to any disclaimer, the term of this patent is extended or adjusted under 35 U.S.C. 154(b) by 308 days.

(21) Appl. No.: 10/622,849

(22) Filed: Jul. 18, 2003

(65) Prior Publication Data

US 2004/0070387 A1    Apr. 15, 2004

Related U.S. Application Data

(60) Provisional application No. 60/397,430, filed on Jul. 18, 2002.

(51) Int. Cl.
*G01R 31/26* (2006.01)
(52) U.S. Cl. ...................................................... 324/765
(58) Field of Classification Search .................. None
See application file for complete search history.

(56) References Cited

U.S. PATENT DOCUMENTS

| | | | |
|---|---|---|---|
| 4,027,246 A * | 5/1977 | Caccoma et al. ............. 29/430 |
| 4,141,458 A * | 2/1979 | Brooks et al. ......... 414/331.18 |
| 4,618,938 A * | 10/1986 | Sandland et al. ........... 382/148 |
| 4,836,733 A * | 6/1989 | Hertel et al. ................... 29/720 |
| 4,938,654 A * | 7/1990 | Schram ....................... 414/757 |
| 5,105,147 A * | 4/1992 | Karasikov et al. ........... 324/750 |
| 5,224,809 A * | 7/1993 | Maydan et al. ............. 414/217 |
| 5,773,989 A * | 6/1998 | Edelman et al. ............ 324/765 |
| 6,137,303 A * | 10/2000 | Deckert et al. ............. 324/765 |
| 6,317,647 B1 * | 11/2001 | Akaike et al. .............. 324/765 |
| 6,324,298 B1 * | 11/2001 | O'Dell et al. ............... 382/149 |
| 6,340,405 B2 * | 1/2002 | Park ........................... 438/706 |
| 6,450,755 B1 * | 9/2002 | Cameron et al. ...... 414/416.08 |
| 6,503,043 B1 * | 1/2003 | Smith et al. ............ 414/331.14 |
| 6,545,458 B2 * | 4/2003 | Yamazaki ................... 324/758 |
| 6,562,184 B2 * | 5/2003 | Sommer ..................... 438/691 |
| 2002/0011835 A1 * | 1/2002 | Yamazaki ................. 324/158.1 |
| 2003/0032207 A1 * | 2/2003 | Rengarajan et al. ........ 324/750 |
| 2005/0083048 A1 * | 4/2005 | Lei et al. .................... 324/229 |

* cited by examiner

*Primary Examiner*—Jermele Hollington
(74) *Attorney, Agent, or Firm*—Dicke, Billig & Czaja, PLLC (57) ABSTRACT

A wafer staging platform for a wafer inspection system for inspecting of semiconductors or like substrates and method of handling wafers. The platform and related method is designed to reduce the amount of time needed to exchange wafers on a processing tool. The staging platform can include a vacuum-assisted feature. The method of handling includes simultaneously processing a plurality of wafers, during which the staging platform is employed to temporarily store wafer(s) in close proximity to a next in line station.

20 Claims, 6 Drawing Sheets

WAFER STAGING PLATFORM FOR A WAFER INSPECTION SYSTEM

REFERENCE TO RELATED APPLICATION

This application claims the benefit of U.S. Provisional Application No. 60/397,430, filed Jul. 18, 2002.

BACKGROUND OF THE INVENTION

1. Technical Field

The present invention relates to a system, and process for use thereof, for inspecting wafers and other semiconductor or microelectronic substrates.

2. Background Information

Over the past several decades, microelectronics and semiconductors have exponentially grown in use and popularity. Microelectronics and semiconductors have in effect revolutionized society by introducing computers, electronic advances, and generally revolutionizing many previously difficult, expensive and/or time consuming mechanical processes into simplistic and quick electronic processes. This boom has been fueled by an insatiable desire by business and individuals for computers and electronics, and more particularly, faster, more advanced computers and electronics whether it be on an assembly line, on test equipment in a lab, on the personal computer at one's desk, or in the home via electronics and toys.

The manufacturers of microelectronics and semiconductors have made vast improvements in end product quality, speed and performance as well as in manufacturing process quality, speed and performance. However, there continues to be demand for faster, more reliable and higher performing semiconductors.

One process that has evolved over the past decade plus is the microelectronic and semiconductor inspection process. The merit in inspecting microelectronics and semiconductors throughout the manufacturing process is obvious in that bad wafers may be removed at the various steps rather than processed to completion only to find out a defect exists either by end inspection or by failure during use. In the beginning, wafers and like substrates were manually inspected such as by humans using microscopes. As the process has evolved, many different systems, devices, apparatus, and methods have been developed to automate this process, such as the method developed by August Technology and disclosed in U.S. Pat. No. 6,324,298, which is incorporated herein by reference. Many of these automated inspection systems, devices, apparatus, and methods focus on two dimensional inspection, that is inspection of wafers or substrates that are substantially or mostly planar in nature.

Figure 1:
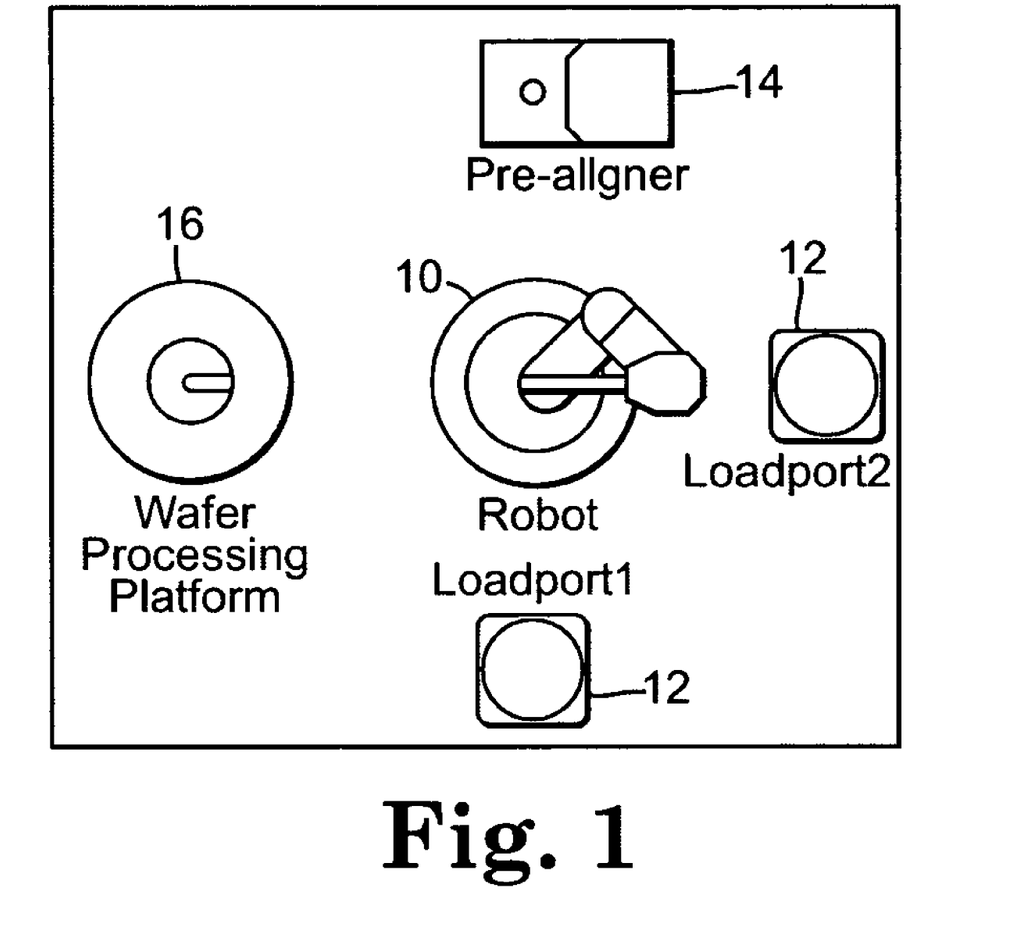
FIGS. 1-13 are views of the prior art.

To perform such inspection, it is necessary to handle the substrates, such as wafers, to be inspected. While the specific design and layout of the components may vary, a standard layout for a wafer handling system is shown in FIG. 1 (prior art) and typically is comprised of the following components: a robot 10, one or more loadports 12, a pre-aligner 14, and a wafer processing platform 16. The robot 10 is used to perform the automated handling. The loadport 12 is used to present a wafer cassette to the system. A wafer cassette or magazine is used to store multiple wafers before and after processing. The pre-aligner 14 is used to center and orientate the wafer for processing by a processing tool, such as an inspection tool, photo-lithography scanner/stepper, or laser repair tool. The wafer processing platform 16 is the stage on which the wafer rests during processing.

Figure 2:
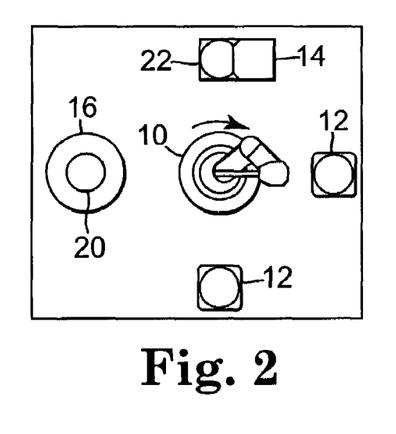
Figure 3:
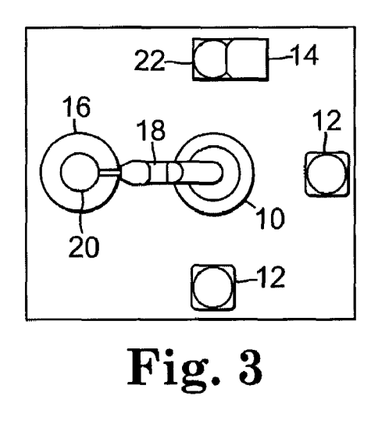
Figure 4:
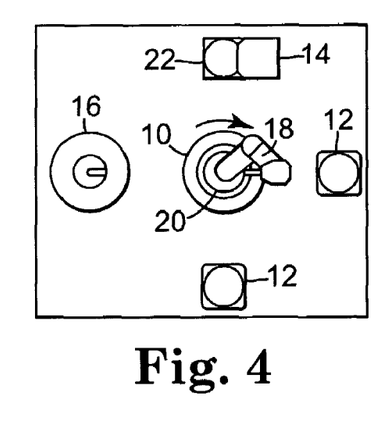
Figure 5:
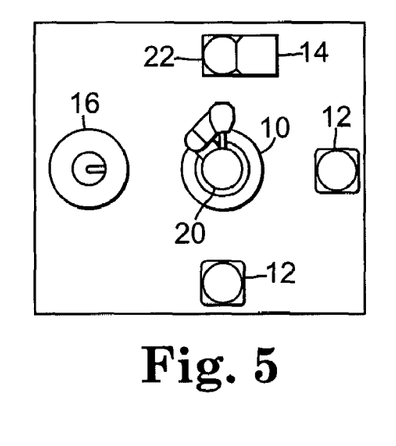
Figure 6:
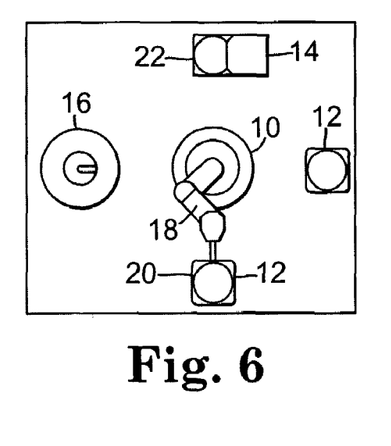
Figure 7:
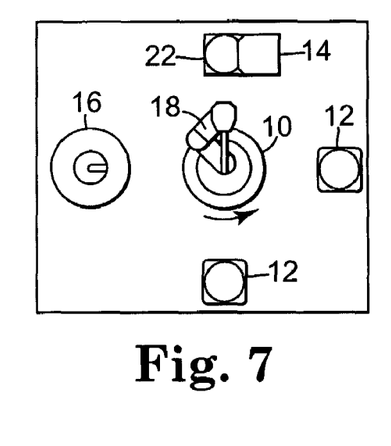
Figure 8:
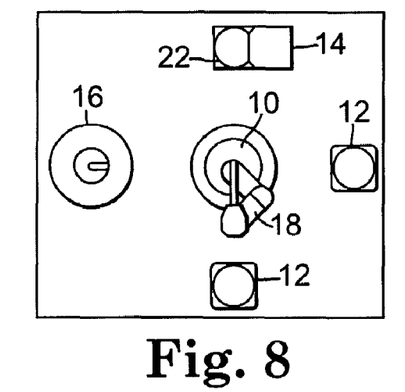
Figure 9:
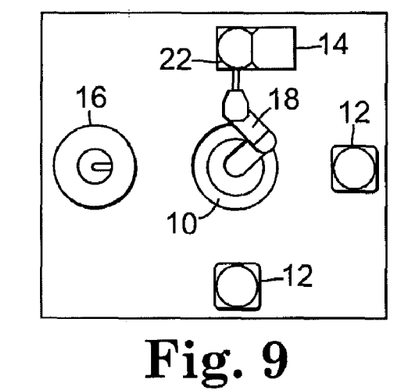
Figure 10:
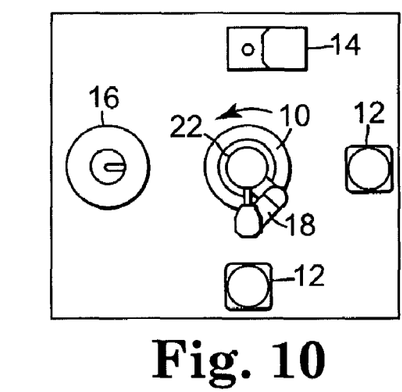
Figure 11:
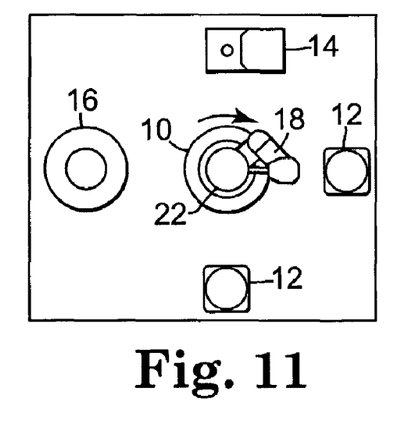
Figure 12:
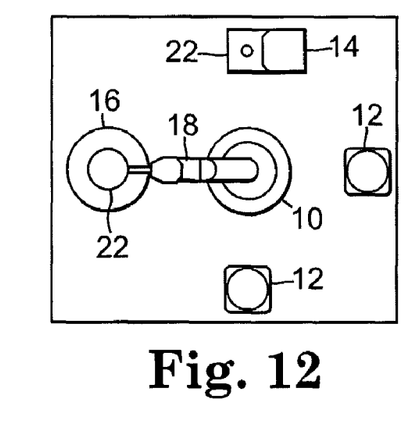
Figure 13:
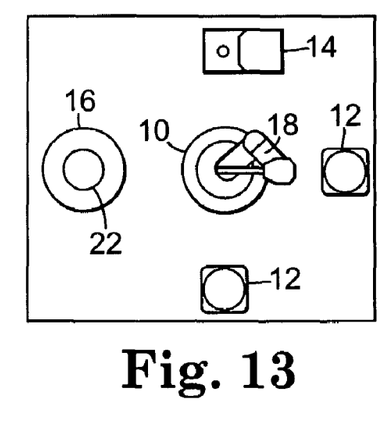

Based on the typical standard configuration as set forth in FIG. 1, the following scenario demonstrates how wafer handling is performed by a standard wafer handling system. In this scenario, a wafer 20 is currently being processed, and another wafer 22 has been staged on the pre-aligner 14. FIG. 2 shows the processing of wafer 20 as complete with the staged wafer 22 on the pre-aligner 14. FIG. 3 shows the robot arm 18 extended and the processed wafer 20 removed. FIG. 4 shows the robot arm 18 retracted and rotated in a clockwise direction. FIG. 5 shows the robot 10 aligned with the wafer 20 in preparation for presentation to a cassette of loadport 12. FIG. 6 shows the robot arm 18 extended and the wafer 20 placed in a cassette of loadport 12. FIG. 7 shows the robot arm 18 retracted and rotated in a counter clockwise direction. FIG. 8 shows the robot 10 aligned with the pre-aligner 14. FIG. 9 shows the robot arm 18 extended and the wafer 22 removed. FIG. 10 shows the robot arm 18 retracted and rotated in a counter clockwise direction. FIG. 11 shows the robot 10 aligned with the processing platform 16. FIG. 12 shows the robot arm 18 extended and the wafer 22 placed on the processing platform 16. FIG. 13 shows the robot arm 18 retracted such that processing of wafer 22 may begin.

SUMMARY OF THE INVENTION

The handling of semiconductors or like substrates by the present invention significantly reduces transfer time by reducing the swap time of samples as there exists two sample holders placed near the processing platform for at least the purpose of reducing swap time.

BRIEF DESCRIPTION OF THE DRAWINGS

Preferred embodiments of the invention, illustrative of the best mode in which applicant has contemplated applying the principles, are set forth in the following description and are shown in the drawings and are particularly and distinctly pointed out and set forth in the appended claims.

Similar numerals refer to similar parts throughout the drawings.

DETAILED DESCRIPTION OF THE PREFERRED EMBODIMENT

Figure 14:
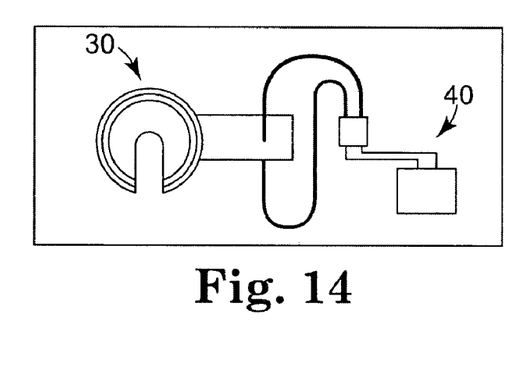
FIG. 14 is a top view of the wafer staging platform of the present invention wafer handling system.
Figure 15:
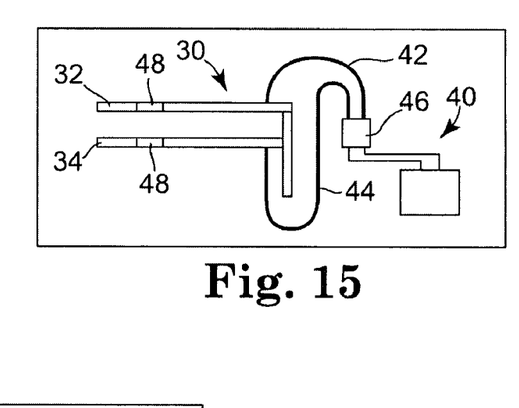
FIG. 15 is a side view of the wafer staging platform of FIG. 14.
Figure 16:
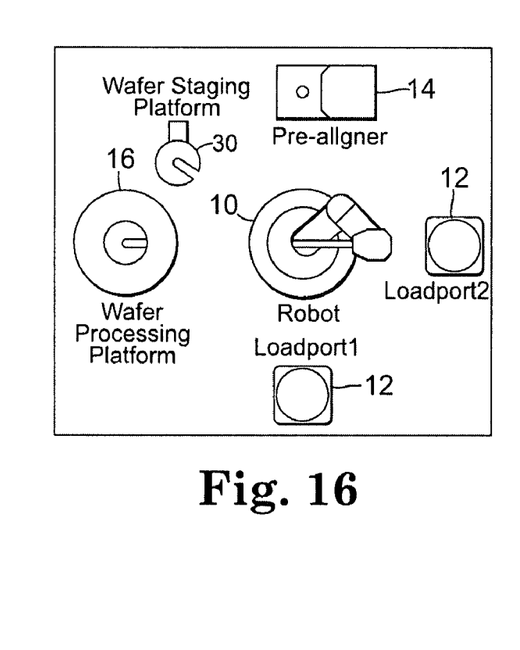
FIG. 16 is a layout view of the overall wafer handling system of the present invention with the wafer staging platform as shown in FIGS. 14-15 shown therein.

The handling system of the present invention is best shown in FIGS. 14-16. In accordance with one of the features of the invention, the handling system includes the novel and unique wafer staging platform 30 as shown best in FIGS. 14-15 that provides both a staging area or first platform 32 for a wafer waiting to be processed, and a temporary location or second platform 34 to place a processed wafer while the staged wafer is presented to the processing tool. The platforms 32, 34 can be arranged one above the other as shown in FIG. 15. FIG. 16 best illustrates the layout of the wafer handling system of the present invention with this wafer staging platform 30.

Other features of the wafer staging platform 30 include a vacuum system 40 including vacuum lines 42, 44 for holding the wafers securely in place, and wafer sensing to allow wafer detecting by the processing tool. Wafer sensing can be performed by either a vacuum sensor 46 or an optical sensor 48 depending on the application.

Robotic arm 18 is a two part arm which has two sections, the first of which pivots about a center support and the second of which pivots about the end of the first. Surrounding the robotic arm in one embodiment is the wafer staging platform 30, at least one loadport or cassette receiver 12 (two shown in the Figures), which receives standard wafer transportation cassettes in which multiple wafers are stacked, an optional wafer pre-aligner 14, which would provide a pre-alignment or rough alignment of the wafer, and the wafer processing platform 16.

Wafer processing platform 16 is a rotary stage that is equipped with a universal interface platform with vacuum, all of which provides a flexible interface for wafer and die package fixturing. It is defined such that it quickly mounts and inspects whole wafers, sawn wafers on film frame, die in gel pak, die in waffle-pak, MCM, JEDEC trays, Auer boats, and other wafer and die package arrangements and configurations.

In use, the wafer handling system with the wafer staging platform 30 provides the ability to stage and unload wafers in close proximity to the processing platform 16, thereby providing significant time savings in the transfer. It has been shown that transfer time may be reduced by as much as 80 percent as compared to the system shown and described in FIGS. 1-13.

Figure 17:
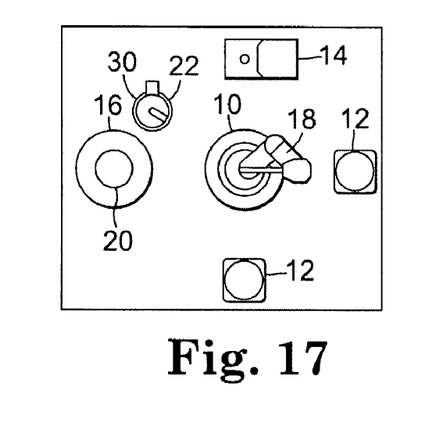
FIGS. 17-28 show process views of the present invention.
Figure 18:
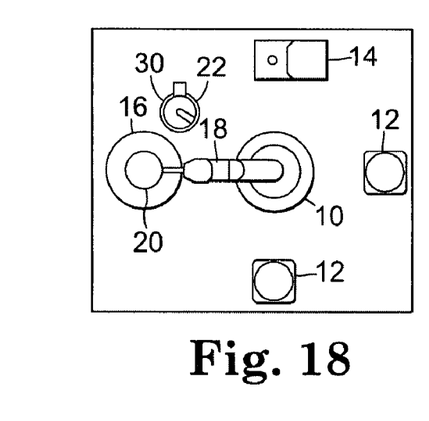
Figure 19:
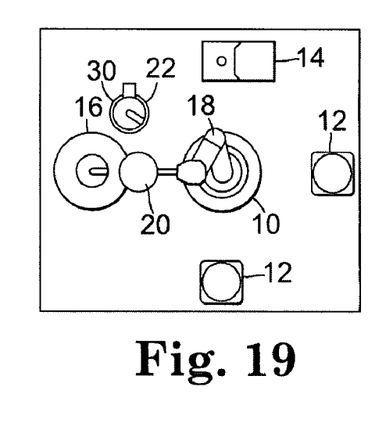
Figure 20:
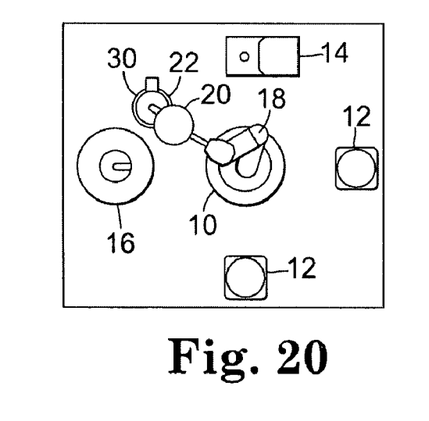
Figure 21:
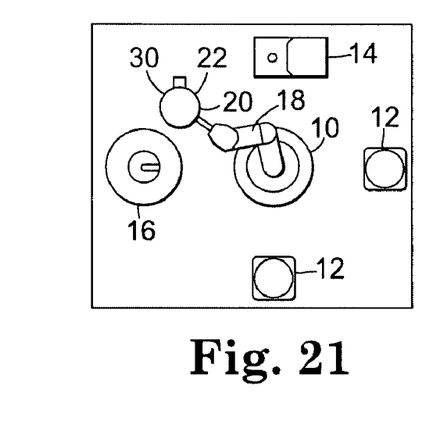
Figure 22:
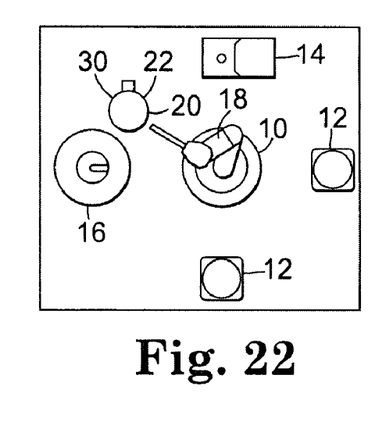
Figure 23:
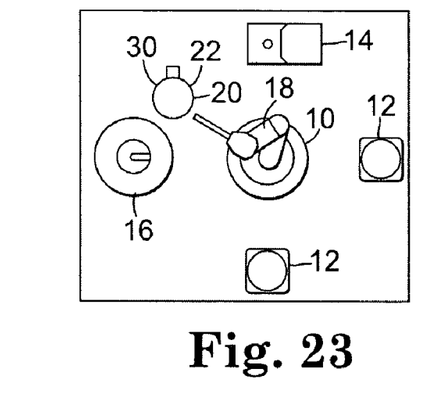
Figure 24:
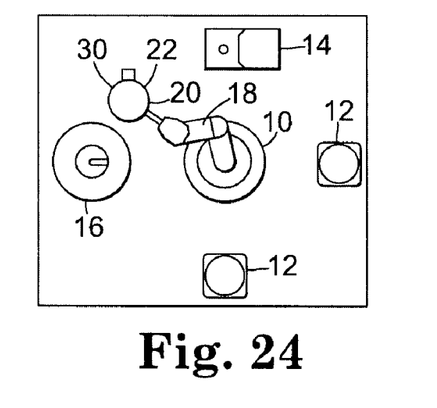
Figure 25:
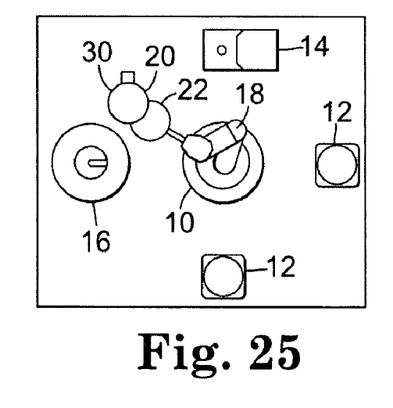
Figure 26:
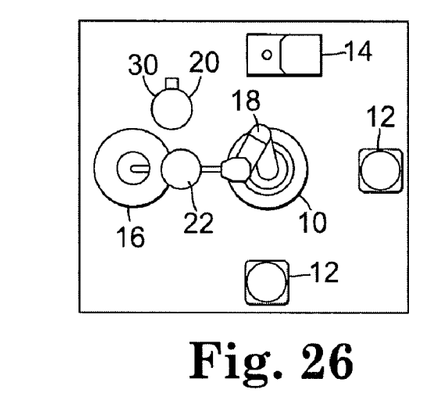
Figure 27:
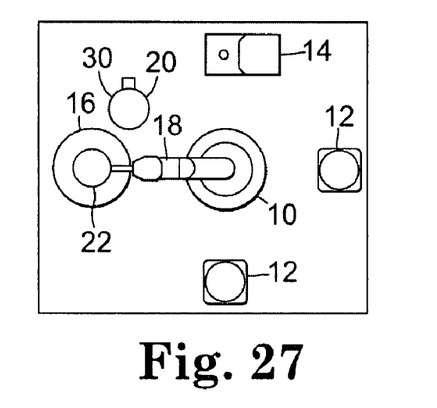
Figure 28:
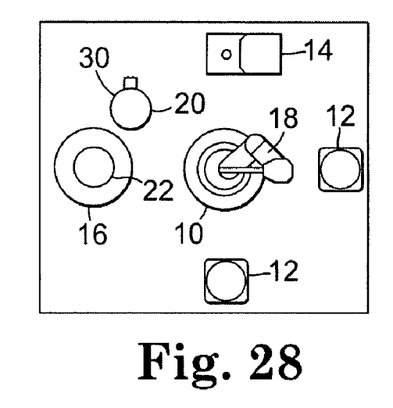

One example of a method of handling a wafer is shown in FIGS. 17-28. Based on the configuration, the following scenario demonstrates wafer handling performed by the present invention including the wafer staging platform 30. In this scenario, a wafer 20 is currently being processed, and another wafer 22 has been staged on the wafer staging platform 30. FIG. 17 shows the processing complete with the staged wafer 22 on the wafer staging platform 30. FIG. 18 shows the robot arm 18 extended and the processed wafer 20 removed. FIG. 19 shows the robot arm 18 retracted and rotated in a clockwise direction. FIG. 20 shows the robot 10 aligned with the wafer 20 in preparation for presentation to the wafer staging platform 30. FIG. 21 shows the robot arm 18 extended to place the wafer 20 on staging platform 30. FIG. 22 shows the robot arm 18 retracted. FIG. 23 shows the robot 10 aligned with the staged wafer 22. FIG. 24 shows the robot arm 18 extended and the wafer 22 removed. FIG. 25 shows the robot arm 18 retracted and rotated in a counter clockwise direction. FIG. 26 shows the robot 10 aligned with the platform 16. FIG. 27 shows the robot arm 18 extended and placing the wafer 22 on the processing platform 16. FIG. 28 shows the robot arm 18 retracted whereby the processing of wafer 22 begins. A wafer can be processed on the processing platform 16 while the robot 10 moves wafers between the loadport(s) 12, the pre-aligner 14, and the wafer staging platform 30.

Accordingly, the invention as described above and understood by one of skill in the art is simplified, provides an effective, safe, inexpensive, and efficient device, system and process, provides for eliminating difficulties encountered with prior devices, systems and processes, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the invention's description and illustration is by way of example, and the invention's scope is not limited to the exact details shown or described.

Having now described the features, discoveries and principles of the invention, the manner in which it is constructed and used, the characteristics of the construction, and the advantageous, new and useful results obtained; the new and useful structures, devices, elements, arrangements, parts and combinations, are set forth in the appended claims.

What is claimed is:

1. A wafer staging platform for a wafer inspection system comprising:
    a first vacuum-assisted platform for holding a first wafer;
    a second vacuum-assisted platform aligned with the first vacuum-assisted platform, the second platform for holding a second wafer;
    wherein the first and second platforms are arranged one above the other and in close proximity to a processing platform.

2. A handling system for a wafer inspection system comprising:
    a wafer processing platform;
    at least two wafer loadports, each wafer loadport configured to receive a wafer transportation cassette;
    a wafer staging platform disposed closer to the wafer processing platform than any of the wafer loadports; and
    a robot configured to move wafers between the wafer processing platform and the wafer staging platform.

3. The handling system of claim 2, wherein the robot moves the wafers between one of the at least two wafer loadports and the staging platform.

4. The handling system of claim 2, wherein the wafer transportation cassette is configured for storing a plurality of wafers, 5. The handling system of claim 2, further comprising:
    a pre-aligner for aligning wafers prior to inspection;
    wherein the robot moves the wafers between the pre-aligner and the wafer staging platform.

6. The handling system of claim 2, wherein the wafer staging platform comprises at least two platforms, each platform configured for holding a wafer.

7. The handling system of claim 2, wherein the wafer staging platform comprises a vacuum system for holding at least one wafer in place on the wafer staging platfonm 8. The handling system of claim 2, further comprising:
    a sensor to determine if a wafer is present on the staging platform.

9. The handling system of claim 8, wherein the staging platform comprises the sensor.

10. The handling system of claim 8, wherein the sensor comprises an optical sensor, 11. The handling system of claim 8, wherein the sensor comprises a vacuum sensor.

12. The wafer staging platform of claim 6, wherein the at least two platforms are aligned in a vertical stack.

13. A method for swapping samples in a wafer inspection system that includes at least one sample loadport and a sample processing platform and a robot to move samples between the sample loadport and the sample processing platform, the method comprising:
    i) storing a plurality of samples in the at least one sample loadport;
    ii) removing a first sample from the loadport;

iii) processing the first sample on the sample processing platform;
iv) removing the first sample from the sample processing platform;
v) staging the first sample on a sample holder such that the sample processing platform is available for processing a second sample; and
vi) returning the first sample to the sample loadport.

14. The method of claim 13, further comprising:
moving the first sample from the sample holder to the at least one sample loadport.

15. The method of claim 13, further comprising:
providing a pre-aligner; and
moving a third sample from the pre-aligner to the sample holder.

16. The method of claim 14, wherein moving the first sample from the sample holder to the at least one sample loadport occurs while a separate sample is being processed on the sample processing platform.

17. The method of claim 15, wherein moving the third sample from the pre-aligner to the sample holder occurs while a separate sample is being processed on the sample processing platform.

18. The method of claim 15, wherein moving a third sample includes moving the third sample from the pre-aligner to a second holder in the sample holder.

19. The method of claim 18, wherein moving the third sample from the pre-aligner to the second holder in the sample holder occurs while a second sample is being processed on the processing platform.

20. The method of claim 13, further comprising:
staging a second sample in the sample holder prior to processing the second sample on the sample processing platform.

* * * * *

UNITED STATES PATENT AND TRADEMARK OFFICE
CERTIFICATE OF CORRECTION

PATENT NO. : 7,230,441 B2 Page 1 of 1
APPLICATION NO. : 10/622849
DATED : June 12, 2007
INVENTOR(S) : Carlson-Stevemer It is certified that error appears in the above-identified patent and that said Letters Patent is hereby corrected as shown below:

At column 3, line 51, before "platform" insert --processing--, therefore

At column 4, line 38, in claim 4, delete "wafers," and insert --wafers.--, therefore.

At column 4, line 48, in claim 7, delete "platfonm" and insert --platform.--, therefore.

At column 4, line 55, in claim 10, delete "sensor," and insert --sensor.--, therefore.

Signed and Sealed this

Thirty-first Day of July, 2007

JON W. DUDAS
*Director of the United States Patent and Trademark Office*